United States Patent [19]

Hsue et al.

[11] Patent Number: 5,667,940
[45] Date of Patent: Sep. 16, 1997

[54] PROCESS FOR CREATING HIGH DENSITY INTEGRATED CIRCUITS UTILIZING DOUBLE COATING PHOTORESIST MASK

[75] Inventors: Chen-Chiu Hsue; Gary Hong, both of Hsin-Chu, Taiwan

[73] Assignee: United Microelectronics Corporation, Hsin-Chu, Taiwan

[21] Appl. No.: 746,147

[22] Filed: Nov. 6, 1996

Related U.S. Application Data

[63] Continuation of Ser. No. 241,336, May 11, 1994, abandoned.
[51] Int. Cl.$^6$ ........................................ G03F 7/26
[52] U.S. Cl. .................. 430/312; 430/313; 430/314; 430/328; 430/330; 430/394
[58] Field of Search ........................... 430/312, 313, 430/314, 328, 330, 394

[56] References Cited

U.S. PATENT DOCUMENTS

| | | | |
|---|---|---|---|
| 4,591,547 | 5/1986 | Brownell | 430/312 |
| 4,704,347 | 11/1987 | Vollenbroek et al. | 430/312 |
| 4,906,552 | 3/1990 | Ngo et al. | 430/312 |
| 5,091,290 | 2/1992 | Rolfson | 430/327 |

*Primary Examiner*—Christopher G. Young
*Attorney, Agent, or Firm*—William H. Wright; Alan S. Raynes

[57] ABSTRACT

A new photolithographic process using the method of photoresist double coating to fabricate fine lines with narrow spacing is described. A layer to be etched is provided overlying a semiconductor substrate. The layer to be etched is coated with a first layer of photoresist and baked. The first photoresist layer is exposed to actinic light through openings in a mask and developed to produce the desired first pattern on the surface of the first photoresist wherein the openings have a minimum width of the resolution limit plus two times the misalignment tolerance of the photolithography process. The layer to be etched is coated with a second photoresist layer where the layer to be etched is exposed within the openings in the first photoresist layer. The second photoresist layer is exposed to actinic light through openings in a mask and developed to produce the desired second pattern on the surface of the second photoresist wherein the second pattern alternates with the first photoresist pattern and wherein the spacing between the first and second patterned photoresist coatings has a width equal to the misalignment tolerance. The misalignment tolerance is much smaller than the resolution limit so the line spacing achieved is narrower than the resolution limit of the photolithography process.

20 Claims, 3 Drawing Sheets

PROCESS FOR CREATING HIGH DENSITY INTEGRATED CIRCUITS UTILIZING DOUBLE COATING PHOTORESIST MASK

This is a continuation of application Ser. No. 08/241,336 filed on May 11, 1994, now abandoned.

BACKGROUND OF THE INVENTION (1) Field of the Invention

The invention relates to the fabrication of integrated circuit devices, and more particularly, to a method of photoresist double coating to fabricate fine lines with narrower spacing than the resolution limit offered by the current best photolithography in the fabrication of integrated circuits.

(2) Description of the Prior Art

In the fabrication of integrated circuits, reductions in both the minimum line width and line spacing can lead to a denser circuit layout or smaller die size for the product. However, the minimum line width and line spacing on the wafer are limited conventionally by photolithography's resolution.

Referring to FIG. 1, there is shown a portion of a partially completed integrated circuit. A layer 12 which is to be etched is deposited over silicon substrate 10. Photoresist layer 14 coats the surface of the layer 12. As shown in FIG. 1, the photoresist layer 14 is patterned to create a photoresist mask. If the resolution of the photolithography process is R and the minimum misalignment tolerance between two layers is M, then the minimum pitch (line width (15)+line spacing (16)) is R+R=2R, by the conventional photolithographic process of the prior art.

U.S. Pat. No. 4,906,552 to Ngo et al describes a flood illumination patterning technique that achieves resolutions of 0.5 micrometers or less using a dual layer of photoresist. U.S. Pat. Nos. 5,091,290 to Rolfson, 4,704,347 to Vollenbroek et al, and 4,591,547 to Brownell all teach methods of dual layers of photoresist in which one layer of photoresist is at least partially over the other layer of photoresist.

SUMMARY OF THE INVENTION

A principal object of the present invention is to provide an effective and very manufacturable method of providing narrow line spacing of less than the resolution limit of the photolithography process.

In accordance with the object of this invention a new photolithographic process using the method of photoresist double coating to fabricate fine lines with narrow spacing is achieved. A layer to be etched is provided overlying a semiconductor substrate. The layer to be etched is coated with a first layer of photoresist and baked. The first photoresist layer is exposed to actinic light through openings in a mask and developed to produce the desired first pattern on the surface of the first photoresist wherein the openings have a minimum width of the resolution limit plus two times the misalignment tolerance of the photolithography process. The layer to be etched is coated with a second photoresist layer where the layer to be etched is exposed within the openings in the first photoresist layer. The second photoresist layer is exposed to actinic light through openings in a mask and developed to produce the desired second pattern on the surface of the second photoresist wherein the second pattern alternates with the first photoresist pattern and wherein the spacing between the first and second patterned photoresist coatings has a width equal to the misalignment tolerance. The misalignment tolerance is much smaller than the resolution limit so the line spacing achieved is narrower than the resolution limit of the photolithography process.

BRIEF DESCRIPTION OF THE DRAWINGS

In the accompanying drawings forming a material part of this description, there is shown.

DESCRIPTION OF THE PREFERRED EMBODIMENTS

Figure 1:
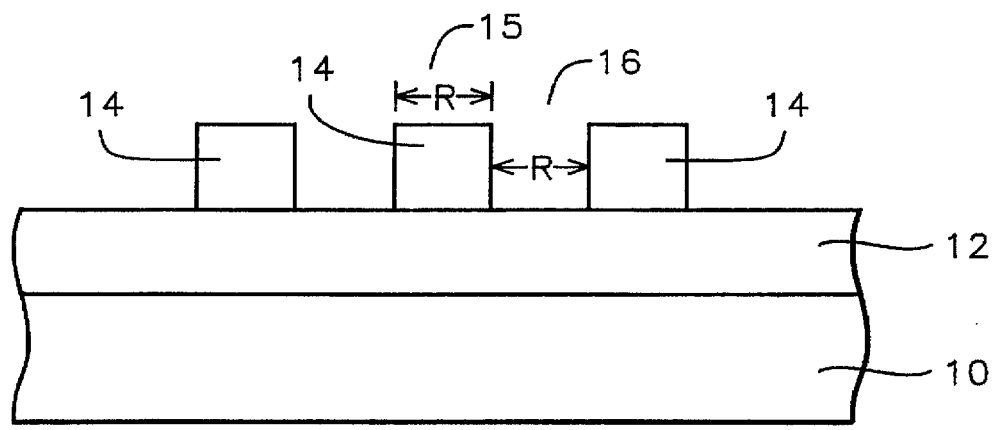
FIG. 1 schematically illustrates in cross-sectional representation a photolithographic process of the prior art.
Figure 2:
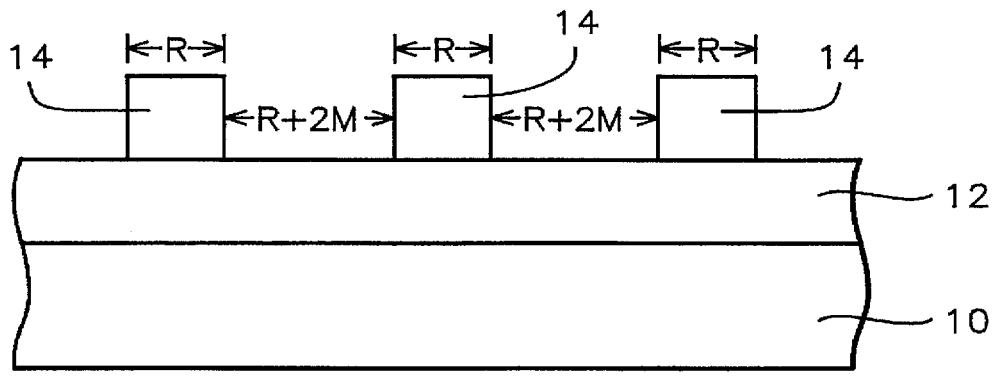
FIGS. 2 through 4 schematically illustrate in cross-sectional representation a preferred embodiment of the present invention.
Figure 3:
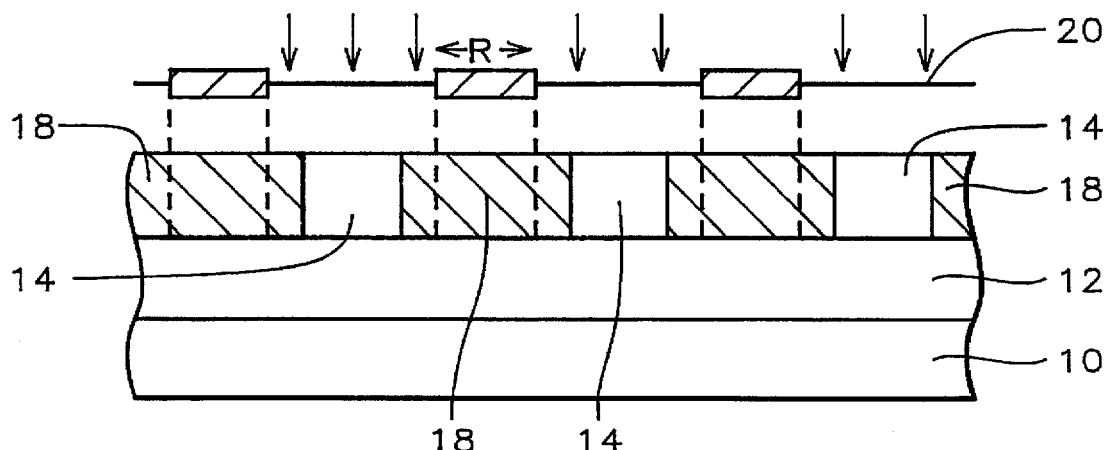
Figure 4:
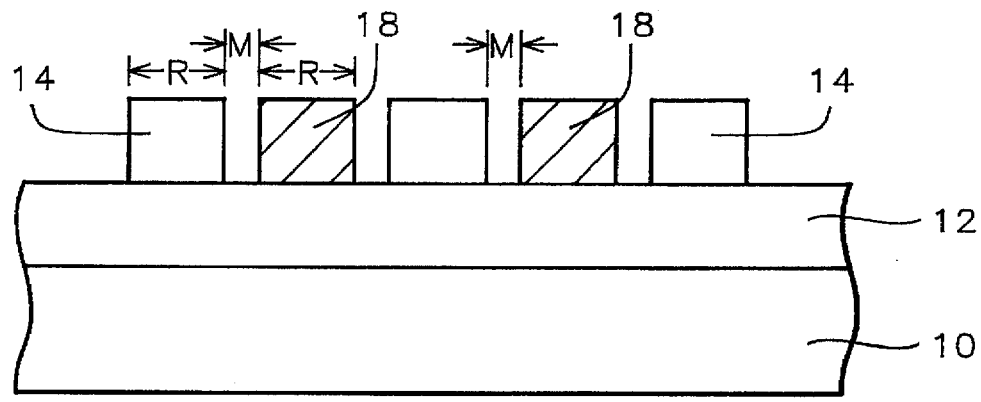

Referring now more particularly to FIGS. 2 through 4, the photolithographic method of the present invention will be described. A layer 12 to be etched has been deposited over the surface of semiconductor substrate 10. This layer can be a single layer or multi-layers and can be a polysilicon word line or metal line or various other structures in the fabrication of an integrated circuit. Specific examples will be discussed in the Examples section to follow. The process of the invention is independent of the material to be etched.

A first layer of photoresist 14 is coated over the surface of the layer 12. A positive photoresist is used with a conventional thickness of between about 10,000 to 30,000 Angstroms. The photoresist layer 14 is exposed to actinic light through openings in a mask and developed to produce the desired pattern on the surface of the photoresist. The resulting resist mask layer 14 has openings of the size R+2M, where R is the line width and M is the misalignment tolerance.

The photoresist mask layer 14 is baked using an ultraviolet baking process at a temperature of between about 140° to 160° C. for between about 50 to 70 seconds. The ultraviolet baking process hardens the photoresist mask layer.

A second photoresist coating 18 is spun onto the wafer into the openings in the photoresist mask layer 14. The photoresist layer 18 is exposed to actinic light through openings in a mask 20, shown in FIG. 3, and developed to produce the desired pattern on the surface of the photoresist. Since the first photoresist mask 14 has been hardened by the ultraviolet baking process, it will not be removed during developing and etching of the second photoresist layer 18. The resulting resist mask layer is illustrated in FIG. 4. The spacing between the lines will be M instead of R as in the prior art. Since M is much smaller than R, the line spacing has been reduced dramatically by using the double photoresist coating method of the invention. For example, for the 0.6 micrometer design rule, R=0.6 micrometers and M is approximately=0.2 micrometers. After the layer 12 has been etched, the photoresist mask layer 14,18 can be stripped using a wet or dry photoresist stripping process, such as sulfuric acid or other stripper chemicals for a wet strip, or oxygen plasma for a dry strip.

EXAMPLES

The following Examples are given to show the important features of the invention and to aid in the understanding thereof and variations may be made by one skilled in the art without departing from the spirit and scope of the invention.

Figure 5:
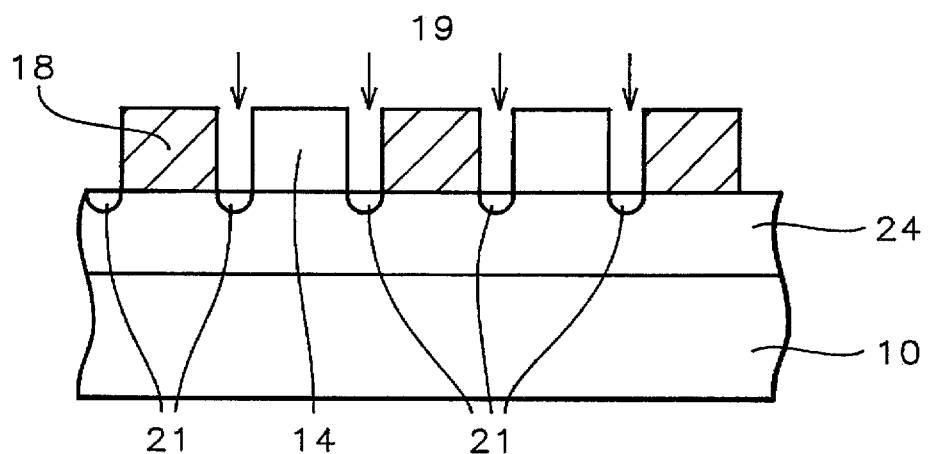
FIGS. 5 through 8 schematically illustrate in cross-sectional representation additional embodiments of the present invention.

The following Examples will illustrate some applications for the double photoresist coating process of the invention. Referring now to FIG. 5, there is illustrated a buried bit mask read-only memory (ROM) process. The double photoresist mask 14 and 18 is fabricated as described above for FIGS. 2 through 4 on the surface of silicon substrate 10. An N+ ion implantation 19 into the substrate 10 through the openings in the photoresist mask forms buried bit lines 21. This process allows the designer to reduce the buried bit line openings and thus reduce the cell size of the memory.

Figure 6:
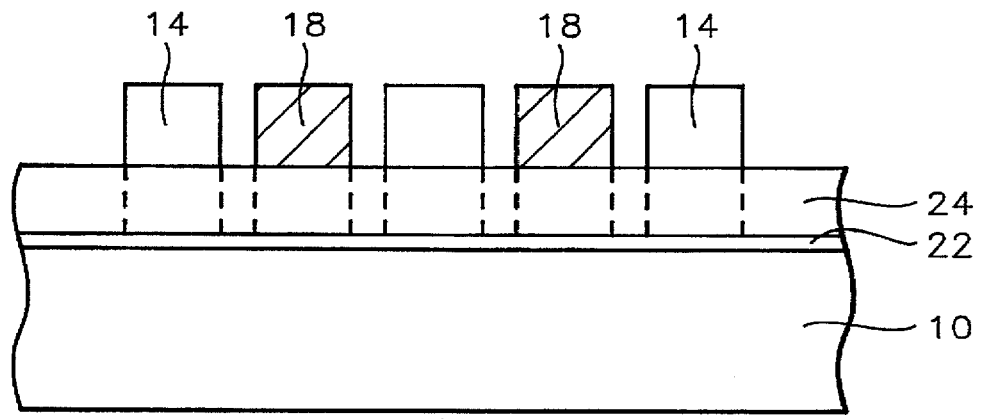
Figure 9:
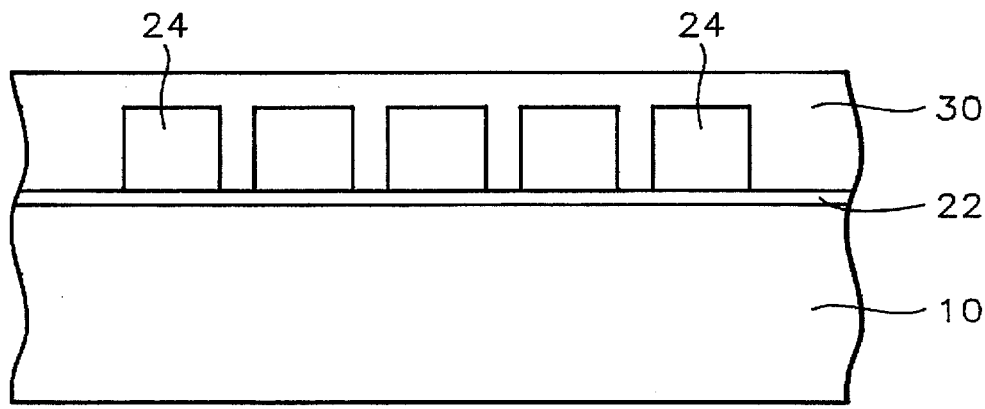
FIG. 9 schematically illustrates in cross-sectional representation a completed integrated circuit for one embodiment of the present invention.

Referring now to FIG. 6, there is illustrated another buried bit mask ROM process in which polysilicon word lines are to be fabricated. A gate silicon oxide layer 22 has been grown or deposited over the surface of the silicon substrate 10. A layer of polysilicon 24 is deposited over the surface of the silicon oxide. The photoresist mask 14 and 18 is fabricated using the double coating method of the invention. The mask will be used to etch polysilicon word lines, indicated by dotted lines within polysilicon layer 24. Reducing the space between the word lines will reduce the cell size of the memory. FIG. 9 illustrates the completed integrated circuit of this example showing the word lines 24 and passivation layer 30 of, for example, borophosphosilicate glass.

Figure 7:
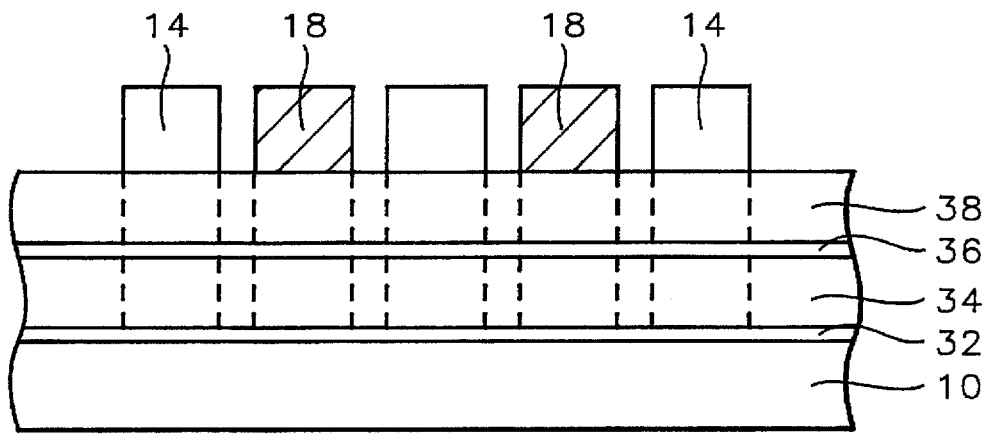

FIG. 7 illustrates a buried bit line or a NAND-typed double polysilicon erasable-programmable read-only memory (EPROM) or a Flash memory. A gate silicon oxide or tunnel silicon oxide layer 32 is grown or deposited on the surface of the silicon substrate 10. Layer 34 is a polysilicon floating gate layer. An interpoly dielectric layer 36 is deposited over the floating gate 34. This layer 36 is typically composed of a multiple ONO layer consisting of silicon oxide, silicon nitride, and silicon oxide. Finally, the control gate polysilicon layer 38 is deposited over the ONO layer. The double photoresist mask 14 and 18 is fabricated following the method of the present invention. A stacked gate composed of layers 38, 36, and 34 will be etched using the double photoresist mask of the invention as indicated by the dotted lines in FIG. 7. The double photoresist coating method increases the cell layout density of the memory.

Figure 8:
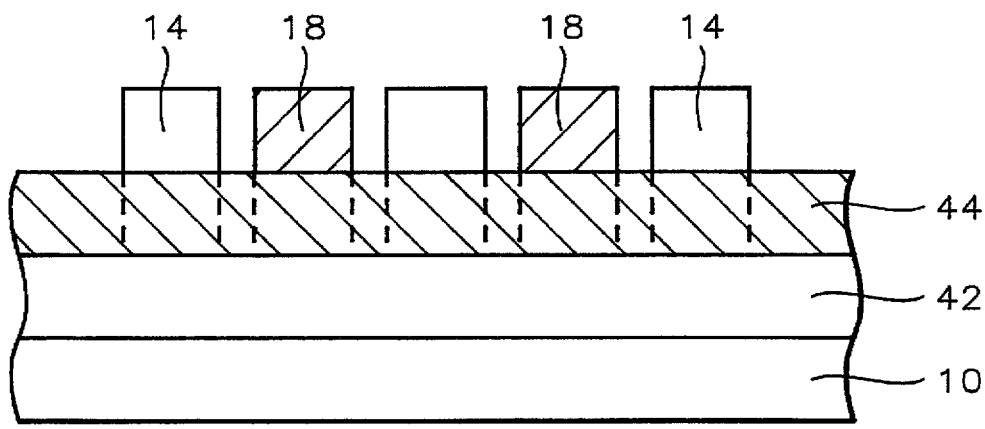

FIG. 8 illustrates metal line definition. The semiconductor substrate 10, which may contain semiconductor device structures such as gate electrodes and source and drain regions, is covered with an insulating layer 42 composed of borophosphosilicate glass (BPSG), for example. A metal layer 44 is deposited over the BPSG layer. The double photoresist mask 14 and 18 of the invention is fabricated over the surface of the metal 44 and is used to etch metal lines as indicated by the dotted lines within layer 44 in FIG. 8.

The double photoresist coating method of the invention may be used in etching active isolation regions and in other etching applications in the manufacture of integrated circuits.

While the invention has been particularly shown and described with reference to the preferred embodiments thereof, it will be understood by those skilled in the art that various changes in form and details may be made without departing from the spirit and scope of the invention.

What is claimed is:

1. A method of forming a double coating photoresist mask to allow line spacing narrower than the photolithography resolution limit in the fabrication of an integrated circuit comprising:

providing a semiconductor substrate including a layer to be etched;

coating said layer to be etched with a first layer of photoresist;

exposing said first photoresist layer to light through a mask, developing said first photoresist layer and removing parts of said first photoresist layer to produce a first pattern from said first photoresist layer having first openings wider than said resolution limit, said first openings flee of photoresist from said first photoresist layer;

hardening said first patterned photoresist layer;

coating said layer to be etched with a second photoresist layer so that said second photoresist layer is within said first openings in said first patterned photoresist layer;

exposing said second photoresist layer to light through a mask, developing said second photoresist layer and removing parts of said second photoresist layer to produce a second pattern from said second photoresist layer having portions of said second pattern within said first openings, said portions of said second pattern within said first openings having first and second edges on opposing sides of said portion, a first edge separated from said first patterned photoresist layer by a first region of the layer to be etched, and a second edge separated from said first patterned photoresist layer by a second region of the layer to be etched, said first and second regions of the layer to be etched lying within said first opening; and wherein at least some of said first and second regions are narrower than said resolution limit of said photolithography process.

2. The method of claim 1, wherein said first patterned photoresist layer is formed on said layer to be etched.

3. The method of claim 2, wherein said second pattern is formed on said layer to be etched.

4. The method of claim 1 wherein said layer to be etched is a stacked gate layer consisting of a polysilicon control gate overlying a dielectric layer overlying a polysilicon floating gate layer.

5. The method of claim 1 wherein said layer to be etched is a metal layer.

6. A method of forming a double coating photoresist mask to allow line widths narrower than the photolithography resolution limit in the fabrication of an integrated circuit comprising:

coating a semiconductor substrate with a first layer of photoresist;

exposing said first photoresist layer to light through a mask, developing said first photoresist layer and removing parts of said first photoresist layer to produce a first patterned photoresist layer having first openings wider than said resolution limit, said first openings free of said first photoresist layer;

hardening said first patterned photoresist layer;

coating said semiconductor substrate with a second photoresist layer so that said second photoresist layer is within said first openings in said first patterned photoresist layer;

exposing said second photoresist layer to light through a mask, developing said second photoresist layer and removing parts of said second photoresist layer to produce a second pattern from said second photoresist layer wherein said second pattern lies within said first openings in said first patterned photoresist layer so that regions of said first patterned photoresist layer are interleaved with regions of said second pattern laterally across at least a portion of said semiconductor substrate, leaving portions of said semiconductor substrate not covered with photoresist between adjacent regions of said first patterned photoresist layer and said second pattern.

7. A method as in claim 6 for forming a double coating resist mask used to form buried bit lines narrower than the photolithography resolution limit, the method further comprising the step of implanting ions into said portions of said semiconductor substrate not covered with photoresist to form said buried bit lines narrower than said resolution limit of said photolithography process.

8. A method as in claim 6, comprising the step of etching said semiconductor substrate not covered by said first and second patterned photoresist layers to form a device having at least some lines narrower than said resolution limit of said photolithography process.

9. A method of forming a double coating photoresist mask to allow for line spacing narrower than the photolithography resolution limit in the fabrication of an integrated circuit comprising:

providing at least one layer to be etched overlying a semiconductor substrate;

coating said layer to be etched with a first layer of photoresist;

exposing said first photoresist layer to light through a mask, developing said first photoresist layer and removing parts of said first photoresist layer to produce a first patterned photoresist layer having first openings wider than said resolution limit as measured along a first direction, said first openings free of photoresist from said first photoresist layer;

hardening said first patterned photoresist layer;

coating said layer to be etched with a second photoresist layer so that said second photoresist layer is within said first openings in said first patterned photoresist layer; and exposing said second photoresist layer to light through a mask, developing said second photoresist layer and removing parts of said second photoresist layer to produce a second pattern from said second photoresist layer which lies within said first openings in said first patterned photoresist layer so that regions of said first patterned photoresist layer are interleaved with regions of said second pattern laterally along said first direction across at least a portion of said layer to be etched, leaving said layer to be etched not covered with photoresist between adjacent regions of said first patterned photoresist layer and said second pattern.

10. A method as in claim 9 for forming a double coating photoresist mask to allow word line spacing narrower than the photolithography resolution limit in the fabrication of an integrated circuit:

wherein said layer to be etched is formed by providing a gate silicon oxide layer over the surface of said semiconductor substrate and depositing a polysilicon layer over said gate silicon oxide layer; and etching said polysilicon layer not covered by said first and second patterned photoresist layers to form polysilicon word line spacing narrower than said photolithography resolution limit.

11. A method as in claim 9 wherein said first photoresist layer is baked under ultraviolet light at a temperature of between about 140° to 160° C. for between about 50 to 70 seconds.

12. A method as in claim 9 for forming a double coating photoresist mask to allow metal line spacing narrower than the photolithography resolution limit in the fabrication of an integrated circuit:

wherein said layer to be etched is formed by providing an insulating layer overlying said semiconductor substrate and depositing a metal layer overlying said insulating layer;

etching said metal layer not covered by said first and second patterned photoresist layers wherein said metal line spacing achieved is narrower than said resolution limit of said photolithography process.

13. The method of claim 9 wherein said layer to be etched is a polysilicon layer.

14. The method of claim 9 wherein said layer to be etched is a stacked gate layer consisting of a polysilicon control gate overlying a dielectric layer overlying a polysilicon floating gate layer.

15. The method of claim 9 wherein said layer to be etched is a metal layer.

16. The method of claim 9 wherein said first openings have a minimum width of the resolution limit of the photolithography process plus two times the misalignment tolerance of said photolithography process and wherein said second photoresist pattern alternates with said first photoresist pattern and wherein the spacing between said first and second patterned photoresist coatings has a width equal to said misalignment tolerance wherein said misalignment tolerance is smaller than said resolution limit and wherein the line spacing achieved is smaller than said resolution limit of said photolithography process.

17. A method as in claim 9 for forming a double coating photoresist mask to allow line spacing of a stacked gate memory narrower than the photolithography resolution limit in the fabrication of an integrated circuit:

wherein said layer to be etched is formed by providing an insulating layer over the surface of said semiconductor substrate, depositing a polysilicon floating gate layer overlying said insulating layer, depositing an interpoly dielectric layer overlying said polysilicon floating gate layer and depositing a control gate polysilicon layer overlying said interpoly dielectric layer; and etching said polysilicon control gate layer, said interpoly dielectric layer, and said polysilicon floating gate layer not covered by said first and second patterned photoresist layers to form said stacked gate structures wherein said line spacings achieved are narrower than said photolithography resolution limit.

18. The method of claim 17 wherein said insulating layer is composed of a gate silicon oxide.

19. The method of claim 17 wherein said insulating layer is composed of a tunnel silicon oxide.

20. The method of claim 17 wherein said interpoly dielectric layer is composed of silicon oxide, silicon nitride, and silicon oxide layers.

* * * * *